United States Patent [19]

Pradel

[11] Patent Number: 5,446,374
[45] Date of Patent: Aug. 29, 1995

[54] POTENTIOMETER MULTIPLIER CIRCUIT, AND AN ELECTRICAL ENERGY METER INCLUDING SUCH A CIRCUIT

[75] Inventor: Denis Pradel, Pierrelaye, France

[73] Assignee: Societe d'Applications Generales d'Electricite et de Mecanique -SAGEM, Paris, France

[21] Appl. No.: 208,670

[22] Filed: Mar. 11, 1994

[30] Foreign Application Priority Data

Mar. 12, 1993 [FR] France ................................ 93 02882

[51] Int. Cl.⁶ .............................................. G01R 7/00
[52] U.S. Cl. .................................... 324/142; 324/141; 364/841; 364/842; 364/848; 364/483; 341/26
[58] Field of Search ................ 324/142, 141; 364/841, 364/842, 848, 483; 341/26

[56] References Cited

FOREIGN PATENT DOCUMENTS 2221313 1/1990 United Kingdom .
9105406 4/1991 WIPO .

OTHER PUBLICATIONS

Advances in Electronics-vol. VII, 1955, Academic Press, New York, US pp. 370-371-Vance et al. "Analog computers", pp. 370-371 FIG. 3.
International Journal of Electronics-vol. 37, No. 3, 1974, London GB pp. 359-361-Pratapa et al. "Four-quadrant hybrid division".

Primary Examiner—Kenneth A. Wieder
Assistant Examiner—Kourosh Cyrus Khosravi
Attorney, Agent, or Firm—Larson and Taylor

[57] ABSTRACT

A circuit has two multiplier modules. Each multiplier module has at least one controllable potentiometer for adjusting the amplitude ratio between an output signal and an input signal of the module. The potentiometers have substantially identical characteristics and they are controlled in the same manner such that the amplitude ratios of the multiplier modules are substantially equal. One of the modules receives as its input signal the first signal to be multiplied and delivers an output signal that is proportional to the product of the two operands, while the other module receives as its input signal a reference voltage and as its output signal it delivers a feedback signal which is servo-controlled to a value that is approximately equal to the value of the second signal to be multiplied. The circuit is applicable to meters for electrical energy.

14 Claims, 4 Drawing Sheets

POTENTIOMETER MULTIPLIER CIRCUIT, AND AN ELECTRICAL ENERGY METER INCLUDING SUCH A CIRCUIT

BACKGROUND OF THE INVENTION

The present invention relates to an electronic circuit for multiplying together two voltage signals.

A particular application of the invention lies in AC electrical energy meters for measuring energy consumption, e.g. of subscribers to mains. Under such circumstances, the voltage signals to be multiplied together represent the voltage and the current delivered to a load as constituted by the electrical installations mounted downstream from the meter.

Voltage multiplier circuits are known that are completely analog, using amplifiers having logarithmic and exponential responses. Such amplifiers require temperature and time compensations that give rise to non-linearities and to offsets that increase with decreasing magnitude of the signals to be multiplied together. Such compensations are difficult to implement accurately over the entire operating range of the circuit.

Potentiometer multiplier circuits are also known in which one of the voltages to be multiplied is converted into a digital value that is used for controlling the position of a potentiometer wiper. The potentiometer receives the other voltage to be multiplied, and its output delivers a signal proportional to the product. When high resolution is required, the potentiometer must comprise a large number of resistors connected in series. In order to ensure that the response of the circuit is linear, the various resistors must have characteristics that are as uniform as possible. The greater the number of resistors in the potentiometer, the more difficult this condition is to achieve. Known potentiometer circuits are therefore difficult to optimize simultaneously in terms of resolution and of accuracy.

SUMMARY OF THE INVENTION

The object of the present invention is to provide a potentiometer multiplier circuit having better linearity at given resolution, and that is particularly suitable for implementing in the form of an integrated circuit.

The circuit of the invention comprises two multiplier modules each comprising at least one controllable potentiometer for adjusting the amplitude ratio between an output signal and an input signal of the multiplier module, each potentiometer being constituted by an array of resistors in series associated with a set of switches each connected between a respective node of the array of resistors and a common output of the potentiometer. The potentiometers have characteristics that are substantially identical and they are controlled in the same manner by a sequential control unit such that the amplitude ratios of the multiplier modules are constantly substantially equal. A first multiplier module receives as its input signal the first voltage signal and delivers an output signal proportional to the product of the two operands. The second multiplier module receives as its input signal a reference voltage and delivers as its output signal a feedback signal. The circuit further includes means for comparing the feedback signal with the second voltage signal, and in the event of a significant difference between said two signals, for producing correction signals that are applied to the sequential control unit for changing the amplitude ratios in corresponding manner.

The linearity of the response is the result of the amplitude ratios of the two multiplier modules being identical. Such identity can be obtained with high accuracy since it depends only on the resistors of the same rank within the potentiometers having characteristics that are identical. In integrated circuit technology in particular, one of the highest degrees of accuracy that can be obtained without adjustment is to be found in matching the values of two resistors that are geometrically similar, adjacent, and interleaved. Thus, the amplitude ratios in the two modules can be made practically equal, by matching same-rank resistors of the potentiometers in pairs. The accuracy with which amplitude ratios are identical is further increased by the potentiometers including a large number of resistors. The difference between their amplitude ratios constitutes an error averaged over individual resistor ratios taken in pairs. Statistically, the greater the number of resistors, the smaller the value of this average error.

The invention also provides a meter for metering AC electrical energy consumption in a load, the meter comprising means for providing two voltage signals one proportional to the voltage applied to the load and the other proportional to the current flowing through the load, a multiplier circuit of the above-defined type delivering a power signal proportional to the algebraic product of the two voltage signals, and means using the power signal to provide an indication of the electrical energy consumed in the load.

DESCRIPTION OF PREFERRED EMBODIMENTS

Figure 1:
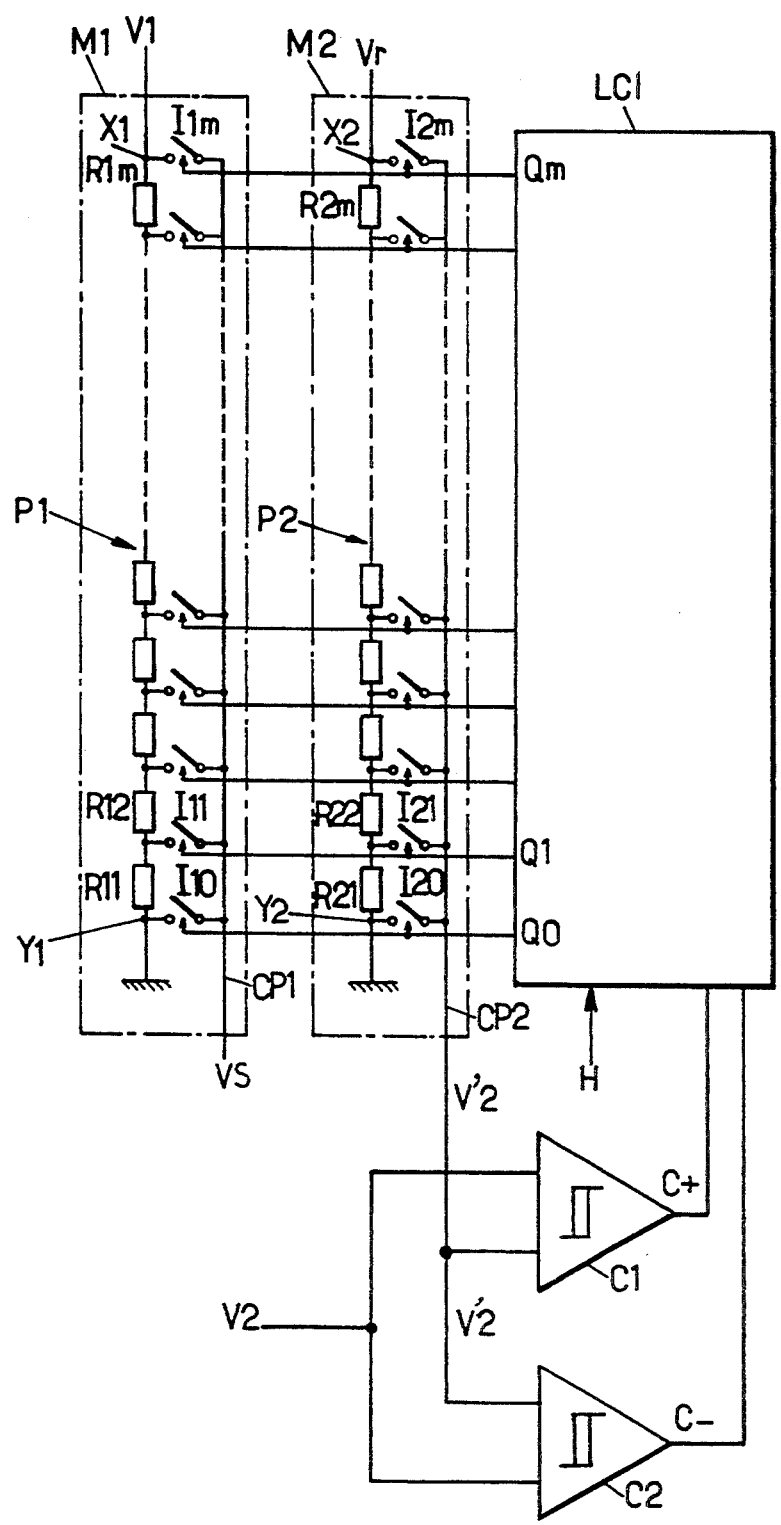
FIGS. 1 and 2 are circuit diagrams showing two respective embodiments of a multiplier circuit of the invention.
Figure 2:
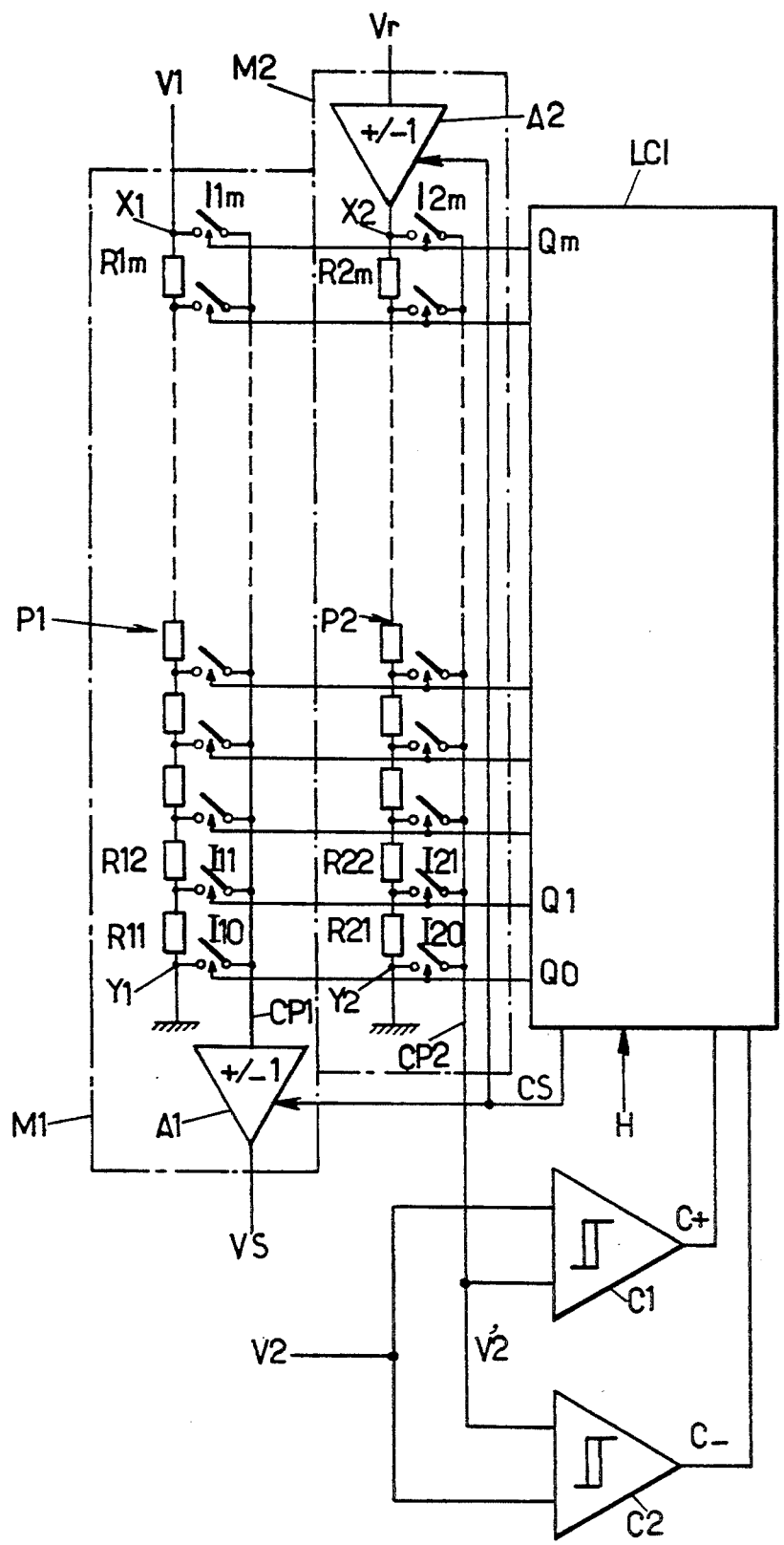

Each of the electronic circuits shown in FIGS. 1 and 2 comprises two multiplier modules M1 and M2. The first module M1 receives as its input signal a voltage signal V1 representative of a first operand to be multiplied, and delivers an output signal Vs proportional to V1 in an amplitude ratio $$k1 = |Vs/V1|.$$

The second module M2 receives as its input signal a constant reference Voltage Vr and it delivers as its output signal a feedback signal V'2 proportional to Vr in an amplitude ratio $$k2 = |V'2/Vr|.$$

The ratios Vs/V1 and V'2/Vr are adjusted by a sequential control unit LCI that is clocked by a clock signal H.

The circuit also includes two comparators C1 and C2, each having two inputs respectively receiving the feedback signal V'2 from the second module M2 and a voltage V2 representative of the second operand to be multiplied. The comparator C1 delivers a signal C+ representative of the difference (V2−V'2) when positive.

The comparator C2 delivers the signal C- representative of the difference (V2−V'2) when negative. These two signals C+ and C− are both correction signals that are respectively applied to an increment input and to a decrement input of the sequential control unit LCI. The unit LCI includes a counter which, on each clock period H, is incremented by a value corresponding to the correction signal C+, or is decremented by a value corresponding to the correction signal C−. The period of the clock signal H is selected to be less than the time scale of variations in the voltage signal V2. The sequential control unit controls the modules M1 and M2 as a function of the value of the counter, as explained below.

In the example shown in FIG. 1, each of the two modules M1 and M2 is constituted by a potentiometer P1 or P2. The potentiometers P1 and P2 are identical in structure. Each comprises an array of m series-connected resistors R11, R12, ..., R1m [R21, R22, ..., R2m] connected between a terminal X1 [X2] receiving the input signal V1 [Vr] for the module and an opposite terminal Y1 [Y2] connected to ground, and associated with a set of m+1 switches I10, I11, ..., I1m [I20, I21, ..., I2m]. Switch I1j [I2j] (0<j<m) is connected between a node of the corresponding array situated between resistors R1j and R1(j+1) [R2j and R2(j+1)] and a common output CP1 [CP2] constituting the wiper of the potentiometer. Switch I10 [I20] is connected between a corresponding node of the array constituted by its terminal Y1 [Y2] and the output CP1 [CP2]. Switch I1m [I2m] is mounted between a corresponding node of the array constituted by terminal X1 [X2] and its output CP1 [CP2].

For each index j lying in the range 1 to m, the resistors R1j and R2j are paired so as to have substantially identical characteristics (resistances). When the circuit is made in integrated form, each resistor may be constituted by a zone of silicon with controlled doping and having dimensions of the order of a few tens of microns. The paired resistors then have geometrical characteristics that are as similar as possible and they are disposed in such a manner as to be physically interleaved. For each index j lying in the range O to m, the switches I1j and I2j take up the same position (open or closed) under the control of a signal Qj given by the sequential control unit LCI. Thus, the amplitude ratios k1 and k2 of the multiplier modules are constantly substantially equal.

The sequential control unit LCI generates signals Q0, Q1, ..., Qm as a function of the value of its counter in such a manner as to ensure that there is always only one pair of switches I1j, I2j, that are closed. The comparators C1 and C2, and the unit LCI continuously servo-control the amplitude ratio k1 to the value V2/Vr. Thus, the output signal Vs of the circuit is equal to V1×V2/Vr, with a precision of order 1/m. The significant error that the comparators C1 and C2 must be capable of detecting between the signals V2 and V'2 is of the order of Vr/m.

The number m of resistors per potentiometer is selected as a function of the desired precision. If all of the resistors could have exactly the same resistance, then k1=k2=j/m, where j designates the index of the pair of switches that is closed at the instant under consideration. In practice, it is difficult to obtain reproducible characteristics over a large number of resistors, but by using a configuration in which same-rank resistors of the potentiometers P1 and P2 are paired, it is possible to obtain a very good match between the ratios k1 and k2, even if these ratios happen to be slightly different from the value j/m. Furthermore, because of the statistical reasons mentioned above, the match between the ratios k1 and k2 is even better than the match between the resistances of any pair of resistors.

In the example shown in FIG. 1, the output signal Vs always has the same sign as the voltage signal V1, at least when Vr is positive, such that this circuit enables multiplication to be performed over two quadrants (V2>O).

It may be observed that a circuit analogous to that shown in FIG. 1 can be used for performing multiplication over four quadrants. This can be done merely by not connecting the terminals Y1 and Y2 of the potentiometers P1 and P2 to ground, but in applying thereto respective inverses −V1 of the first voltage signal V1 and −Vr of the reference voltage Vr. Multiplication over four quadrants is then obtained in analogous manner, but resolution is then halved for the same number m of resistors.

FIG. 2 shows another way of implementing multiplication over four quadrants.

In this circuit, the first multiplier module M1 includes a variable gain amplifier A1 whose input is connected to the output CP1 of the potentiometer P1 and whose output delivers the output signal Vs, while the second multiplier module M2 includes a variable gain amplifier A2 whose input receives the reference voltage Vr and whose output is connected to the terminal X2 of the potentiometer P2. The gain of each of the amplifiers A1 and A2 is capable of taking up the value +1 or −1 in response to a binary sign control signal CS issued by the sequential control unit LCI. The signal CS thus controls the sign of the ratios Vs/V1 and V'2/Vr. The unit LCI generates the sign control signal CS so that the gain of the amplifier A2 is equal to −1 or +1 while the value of its counter is respectively negative or positive. The same sign is then applied to the amplifier A1, such that Vs=+V1×V2/Vr regardless of the signs of V1 and V2 (it would also be possible to cause A1 to have gain of opposite sign, in which case Vs=−V1×V2/Vr).

Figure 3:
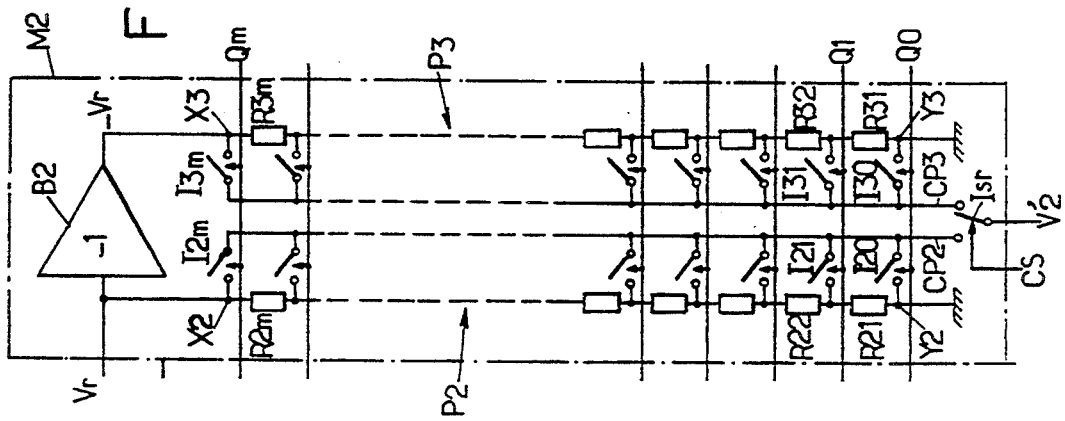

FIG. 3 shows a variant embodiment of the second multiplier module M2 of FIG. 2. In addition to the potentiometer P2, the module M2 shown in FIG. 3 comprises a second potentiometer P3 which is likewise of substantially identical structure to the potentiometers P1 and P2 (resistors R31, R32, ..., R3m connected in series between two terminals X3 and Y3; switches I30, I31, ..., I3m connected to the common output CP3). The terminal X2 of potentiometer P2 receives the reference voltage Vr while the corresponding terminal X3 of the potentiometer P3 receives the inverse −Vr of the reference voltage, as obtained at the output from an inverter B2. A switch Isr selectively connects a terminal at which the output signal V'2 of the module is produced to one or other of two outputs CP2 and CP3 of the two potentiometers P2 and P3, in response to the sign control signal CS from the unit LCI. The output CP2 is at the voltage k2×Vr, whereas the output CP3 is at the voltage −k2×Vr, with the particular output that is selected by the switch Isr depending on the sign of the voltage signal V2.

Figure 4:
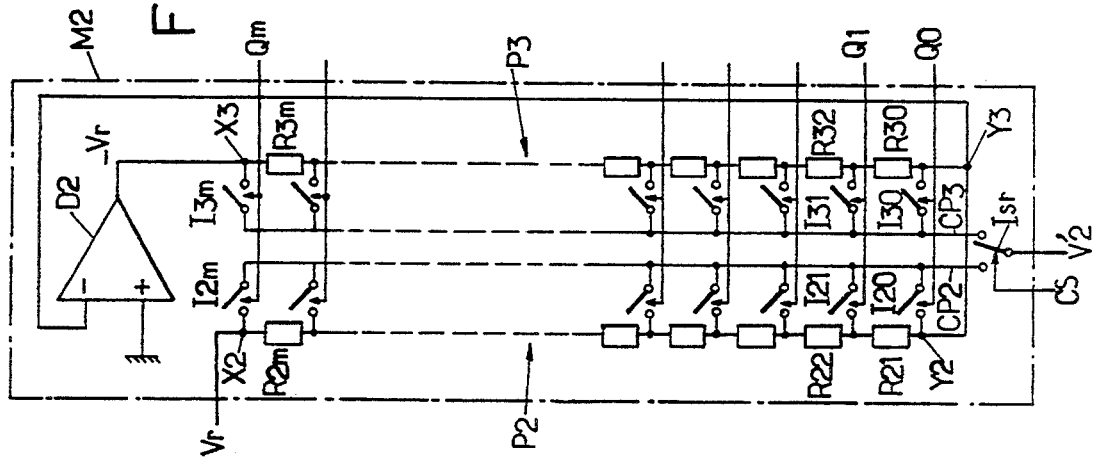
FIGS. 3 and 4 show two variant embodiments of the multiplier modules of the FIG. 2 circuit.

FIG. 4 shows an advantageous way of embodying the inverter that can be used to replace the inverter B2 of FIG. 3. This inverter comprises an amplifier D2 whose positive input is connected to ground, whose negative input is connected to the two corresponding ends Y2 and Y3 of the serially-connected resistor arrays of the two potentiometers P2 and P3 of the module and whose output is connected to the opposite terminal X3 of the serially-connected resistor array of the potentiometer P3, while the terminal X2 of the potentiometer P2 continues to receive the reference voltage Vr. In this way, the total resistance of the potentiometer P2 constitutes the input resistance of the inverter, whereas the total resistance of the potentiometer P3 constitutes the feedback resistance of the inverter. These two total resistances are identical in value to a very high degree of accuracy since their individual resistors are paired and the number of resistors in each array statistically reduces the residual errors between the resistances of the paired resistors.

FIGS. 2 to 4 show four ways of implementing a multiplier module having sign control. The modules M1 and M2 shown in FIG. 2 provide multiplication with sign control without requiring potentiometers to be doubled up, and thus requiring minimum area. The module M2 shown in FIG. 3 has the advantage of greater accuracy since the inverter (amplifier of gain −1) gives rise to less distortion than would an amplifier of controlled gain. Accuracy is further optimized when the inverter makes use of input and feedback resistances that are constituted by the total resistances of potentiometers (FIG. 4) whose resistance values are caused to be practically identical by construction. In practice, and depending on the looked-for properties, it is possible to give each of the two modules of the circuit any one of the structures shown in FIGS. 2 to 4, and it is not necessary for the two modules to have the same structure.

Figure 5:
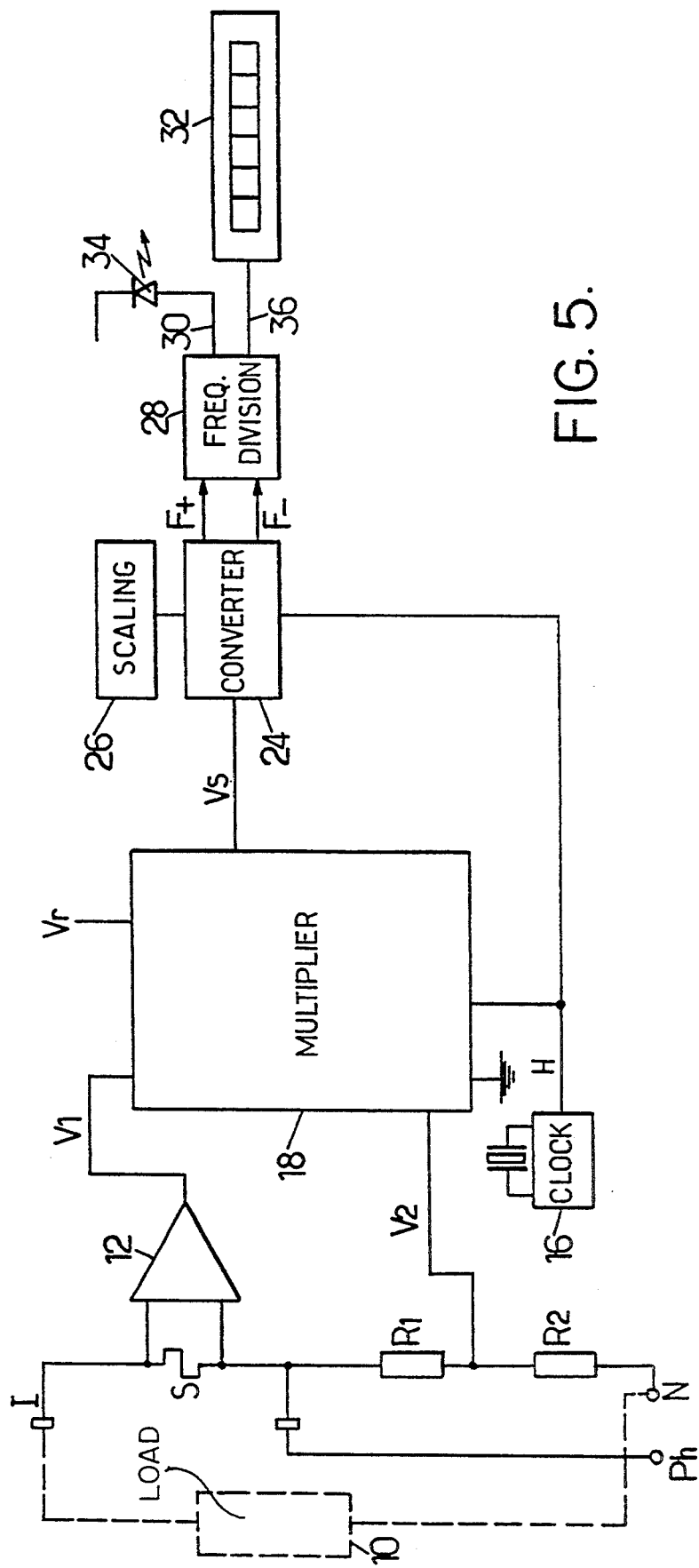
FIG. 5 is a circuit diagram of an electrical energy meter of the invention.

FIG. 5 shows an electrical energy meter incorporating a multiplier circuit 18 of the invention. The meter includes means for generating analog measurement voltage signals V1 and V2 respectively proportional to the current flowing through a load 10 whose consumption is to be measured, and to the voltage across the terminals of said load. The diagram of FIG. 5 corresponds to the load being powered with single-phase AC from a live (phase) terminal Ph and a neutral terminal N. However, the meter can be adapted to a polyphase power supply merely by replicating its components before combining their outputs for a single display.

The means for generating V1 comprise a series resistor S (shunt) carrying the current that flows through the load 10 and associated with a differential amplifier 12 whose inputs are connected to the terminals of the resistor S and whose output delivers the first voltage signal V1.

The means for generating V2 comprise a divider bridge R1-R2 having a midpoint that delivers V2. The resistances of R1 and R2 are chosen so that V2 is compatible with operation of the multiplier circuit.

The circuit 18 multiplies the signals V1 and V2 over four quadrants. For example, it may be constructed as shown in FIG. 2, optionally including the variants of FIGS. 3 and 4. The circuit 18 receives the reference voltage Vr and the clock signal H from a clock 16. Its output signal Vs representative of instantaneous power is applied to a voltage-to-frequency converter 24 clocked by the clock signal H and converting successive values of Vs into pulses each representing a quantum of energy, the pulses being applied to outputs F+ and F− depending on whether the energy is positive or negative, i.e. depending on the sign of Vs. The converter 24 may be of conventional structure, and in particular it may include an input analog integrator associated with a scale factor generator 26 determining the scale factor between Vs and the output frequency F. In the embodiment shown in FIG. 5, where the output display comprises a lamp 34 that gives off a light pulse each time energy consumption has increased by a determined amount (e.g. 1 Wh) and a totalizing counter 32, a block 28 is provided for performing frequency division on the output frequency of the pulses F+ and F− firstly to provide pulses for each increment to be displayed on an output 30 that controls the lamp 34, and secondly to provide one pulse for each increment corresponding to a unit increase of the least significant digit of the totalizing counter 32, which pulse is provided on an output 36 connected to the totalizing counter 32.

I claim:

1. An electronic circuit for multiplying together two operands represented by respective first and second voltage signals, comprising:

a first multiplier module comprising at least one controllable potentiometer for adjusting a first amplitude ratio between an output signal and an input signal of said first multiplier module; and a second multiplier module comprising at least one controllable potentiometer for adjusting a second amplitude ratio between an output signal and an input signal of said second multiplier module, each potentiometer of said first and second multiplier modules being respectively constituted by an array of resistors in connected series and associated with a set of switches each connected between a respective node of said array of resistors and a common output of said potentiometer, the respective array of resistors and set of switches of said potentiometers of said first and second multiplier modules having identical structures and said potentiometers of said first and second modules being controlled in the same manner by a sequential control unit so that said first and second amplitude ratios are constantly substantially equal, the first multiplier module receiving as its input signal the first voltage signal and delivering an output signal proportional to the product of the two operands, while the second multiplier module receives as its input signal a reference voltage and delivers as its output signal a feedback signal, the circuit further including means for comparing the feedback signal with the second voltage signal, and for producing correction signals based on a deviation between said feedback signal and said second voltage signal, said correction signals being applied to the sequential control unit for adjusting said first and second amplitude ratios.

2. A circuit according to claim 1, for multiplying over two quadrants, wherein the first multiplier module comprises a single potentiometer having an output comprising said common. Output and whose array of resistors is connected between a first terminal receiving the first voltage signal and a second terminal connected to ground, the output signal of said first multiplier module being available at the output of said single potentiometer of said first multiplier module, and wherein the second multiplier module comprises a single potentiometer having an output comprising said common output and whose array of resistors is connected between a third terminal raised to the reference voltage and a fourth terminal connected to ground, the feedback signal being available at the output of said single potentiometer of said second multiplier module.

3. A circuit according to claim 1, for multiplication over four quadrants, wherein the first multiplier module comprises a single potentiometer having an output comprising said common output and whose array of resistors is connected between a first terminal receiving the first voltage signal and a second terminal receiving the inverse of the first voltage signal, the output signal of said first multiplier module being available at the output of said single potentiometer of said first multiplier module, and wherein the second multiplier module comprises a single potentiometer having an output comprising said common output and whose array of resistors is connected between a third terminal raised to the reference voltage and a fourth terminal raised to the inverse of the reference voltage, the feedback signal being available at the output of said single potentiometer of said second multiplier module.

4. A circuit according to claim 1, for multiplication over four quadrants, wherein each of said first and second multiplier modules comprises respective controllable sign-selection means for fixing the sign of of said first and second amplitude ratios, respectively, the sign-selection means of the first and second multiplier modules being controlled jointly by the sequential control unit so as to ensure a predetermined relationship between the respective signs of said first and second amplitude ratios.

5. A circuit according to claim 4, wherein at least one of the multiplier modules comprises a single potentiometer and a sign-selection means constituted by an amplifier of controlled gain which takes the value $+1$ or $-1$ in response to a sign control signal from the sequential control unit, the resistor array of said single potentiometer receiving the input signal of said at least one module via said amplifier of controlled gain.

6. A circuit according to claim 4, wherein at least one of the multiplier modules comprises a single potentiometer and sign-selection means constituted by an amplifier of controlled gain whose gain takes the value $+1$ or $-1$ in response to a sign control signal from the sequential control unit, said amplifier of controlled gain having an input connected to the output of said single potentiometer, and a output producing the output signal of said module.

7. A circuit according to claim 4, wherein at least one of the multiplier modules comprises first and second potentiometers each having respective first and second terminals, and a sign-selection means constituted by a switch selectively connecting a node to a selected one of the two respective outputs of said first and second potentiometers, the output signal of said at least one module being produced at said node, the input signal of said at least one module being applied both to said first terminal of said first potentiometer and, via an inverter, to said first terminal of of said second potentiometer, the respective second terminals of said first and second potentiometers being at ground potential.

8. A circuit according to claim 7, wherein said inverter comprises an operational amplifier having a positive input connected to ground, a negative input connected to the respective second terminals of said first and second potentiometers, and an output connected to the first terminal of the second potentiometer.

9. A meter for metering AC electrical energy consumption in a load, the meter comprising means for providing two voltage signals one proportional to a voltage applied to the load and the other, proportional to a current flowing through the load, a multiplier circuit delivering a power signal proportional to the algebraic product of said two voltage signals, and means using the power signal to provide an indication of the electrical energy consumed in the load, wherein the multiplier circuit comprises:

a first multiplier module comprising at least one controllable potentiometer for adjusting a first amplitude ratio between an output signal and an input signal of said first multiplier module; and a second multiplier module comprising at least one controllable potentiometer for adjusting a second amplitude ratio between an output signal and an input signal of said second multiplier module, each potentiometer of said first and second multiplier modules being respectively constituted by an array of resistors connected in series and associated with a set of switches each connected between a respective node of said array of resistors and a common output of said potentiometer, the respective array of resistors and set of switches of said potentiometers of said first and second multiplier modules having identical structures and said potentiometers of said first and second multiplier modules being controlled in the same manner by a sequential control unit so that said first and second amplitude ratios are constantly substantially equal, wherein the first multiplier module receives as its input signal a first one of said two voltage signals and delivers said power signal as its output signal, while the second multiplier module receives as its input signal a reference voltage and delivers as its output signal a feedback signal, the circuit further including means for comparing the feedback signal with a second one of said two voltage signals, and for producing correction signals based on a deviation between said feedback signal and said second voltage signal, said correction signals being applied to the sequential control unit for adjusting said first and second amplitude ratios, the first multiplier module comprising a single potentiometer having an output comprising said common output and whose array of resistors is connected between a first terminal receiving the first voltage signal and a second terminal receiving the inverse of the first voltage signal, the power signal being available at the output of said single potentiometer of said first multiplier module, and the second multiplier module comprising a single potentiometer having an output comprising said common output and whose array of resistors is connected between a third terminal raised to the reference voltage and a fourth terminal raised to the inverse of the reference voltage, the feedback signal being available at the output of said single potentiometer of said second multiplier module.

10. A meter for metering AC electrical energy consumption in a load, the meter comprising means for providing two voltage signals one proportional to a voltage applied to the load and the other proportional to a current flowing through the load, a multiplier circuit delivering a power signal proportional to the algebraic product of said two voltage signals, and means for using the power signal to provide an indication of the electrical energy consumed in the load, wherein the multiplier circuit comprises:

a first multiplier module comprising at least one controllable potentiometer for adjusting a first amplitude ratio between an output signal and an input signal of said first multiplier module; and a second multiplier module comprising at least one controllable potentiometer for adjusting a second amplitude ratio between an output signal and an input signal of said second multiplier module, each potentiometer of said first and second multiplier modules being respectively constituted by an array of resistors in series associated with a set of switches each connected between a respective node of said array of resistors and a common output of said potentiometer, the respective array of resistors and set of switches of said potentiometers of said first and second multiplier modules having identical structures and said potentiometers of said first and second modules being controlled in the same manner by a sequential control unit so that said first and second amplitude ratios are constantly substantially equal, wherein the first multiplier module receives as its input signal a first one of said two voltage signals and delivers said power signal as its output signal, while the second multiplier module receives as its input signal a reference voltage and delivers as its output signal a feedback signal, the multiplier circuit further including means for comparing the feedback signal with a second one of said two voltage signals, and for producing correction signals based on a deviation between said feedback signal and said second voltage signal, said correction signals being applied to the sequential control unit for adjusting said first and second amplitude ratios, and each of said first and second multiplier modules comprising respective controllable sign-selection means for fixing the sign of of said first and second amplitude ratios, respectively, the sign-selection means of the first and second multiplier modules being controlled jointly by the sequential control unit so as to ensure a predetermined relationship between the respective signs of said first and second amplitude ratios.

11. A meter according to claim 10, wherein at least one of the multiplier modules comprises a single potentiometer and a sign-selection means constituted by an amplifier of controlled gain which takes the value $+1$ or $-1$ in response to a sign control signal from the sequential control unit, the resistor array of said single potentiometer receiving the input signal of said at least one module via said amplifier of controlled gain.

12. A meter according to claim 10, wherein at least one of the multiplier modules comprises a single potentiometer and sign-selection means constituted by an amplifier of controlled gain whose gain takes the value $+1$ or $-1$ in response to a sign control signal from the sequential control unit, said amplifier of controlled gain having an input connected to the output of said single potentiometer, and a output producing the output signal of said module.

13. A meter according to claim 10, wherein at least one of the multiplier modules comprises first and second potentiometers each having respective first and second terminals, and a sign-selection means constituted by a switch selectively connecting a node to a selected one of the two respective outputs of said first and second potentiometers, the output signal of said at least one module being produced at said node, the input signal of said at least one module being applied both to said first terminal of said first potentiometer and, via an inverter, to said first terminal of of said second potentiometer, the respective second terminals of said first and second potentiometers being at ground potential.

14. A meter according to claim 13, wherein said inverter comprises an operational amplifier having a positive input connected to ground, a negative input connected to the respective second terminals of said first and second potentiometers, and an output connected to the first terminal of the second potentiometer.

* * * * *